United States Patent
Wallander

(10) Patent No.: US 9,515,630 B2
(45) Date of Patent: Dec. 6, 2016

(54) MUSICAL DYNAMICS ALTERATION OF SOUNDS

(76) Inventor: Arne Wallander, Stockholm (SE)

( * ) Notice: Subject to any disclaimer, the term of this patent is extended or adjusted under 35 U.S.C. 154(b) by 497 days.

(21) Appl. No.: 13/979,030

(22) PCT Filed: Jan. 10, 2012

(86) PCT No.: PCT/SE2012/050009
§ 371 (c)(1),
(2), (4) Date: Jul. 10, 2013

(87) PCT Pub. No.: WO2012/096617
PCT Pub. Date: Jul. 19, 2012

(65) Prior Publication Data
US 2013/0287227 A1    Oct. 31, 2013

Related U.S. Application Data

(60) Provisional application No. 61/431,608, filed on Jan. 11, 2011.

(30) Foreign Application Priority Data

Jan. 11, 2011   (SE) ...................................... 1150008

(51) Int. Cl.
*H03G 5/00* (2006.01)
*H03G 5/16* (2006.01)
(Continued)

(52) U.S. Cl.
CPC .............. *H03G 5/165* (2013.01); *G10H 1/125* (2013.01); *G10H 1/46* (2013.01); *G10L 21/0316* (2013.01);
(Continued)

(58) Field of Classification Search
CPC ......... H03G 5/165; H03G 5/005; G06F 3/165; G10H 1/125; G10H 1/46; G10L 21/0316; G10L 25/90; H04R 3/04; H04R 2430/01; H04R 2430/03 381/103, 107, 104, 106, 119, 98; 84/661; 704/500; 700/94
See application file for complete search history.

(56) References Cited

U.S. PATENT DOCUMENTS

| 3,254,161 A | 5/1966 | Svala | |
|---|---|---|---|
| 2006/0114979 A1* | 6/2006 | Pedersen et al. | H03G 5/025 375/229 |

(Continued)

FOREIGN PATENT DOCUMENTS

| JP | 2010-239458 A | 10/2010 |
|---|---|---|
| WO | WO 2008/103757 A1 | 8/2008 |

OTHER PUBLICATIONS

Redline Equalizer 2008-2009 112 dB Catalog.*
(Continued)

*Primary Examiner* — Vivian Chin
*Assistant Examiner* — Ammar Hamid
(74) *Attorney, Agent, or Firm* — Blank Rome LLP

(57) ABSTRACT

An improved method and arrangement for altering musical dynamics of a sound S included in a sound signal is disclosed. The altering of the musical dynamics is performed by filtering and amplification of the sound signal. The filtering is performed by the use of a parametric equalizer, the parametric equalizer having a first gain $G_1$ and a resonance frequency $f_r$ being related to a pitch frequency $f_p$ of said sound S. The amplification is performed by an amplifier amplifying the sound signal with a second gain $G_2$, the second gain $G_2$ being dependent on the first gain $G_1$.

27 Claims, 4 Drawing Sheets

(51) Int. Cl.
*G10L 21/0316* (2013.01)
*H04R 3/04* (2006.01)
*G10H 1/12* (2006.01)
*G10H 1/46* (2006.01)
*H03G 3/00* (2006.01)
*G10L 25/90* (2013.01)

(52) U.S. Cl.
CPC ............... *H03G 5/005* (2013.01); *H04R 3/04* (2013.01); *G10L 25/90* (2013.01); *H04R 2430/01* (2013.01); *H04R 2430/03* (2013.01)

(56) References Cited

U.S. PATENT DOCUMENTS

2006/0128342 A1   6/2006   Marholev
2009/0031886 A1   2/2009   Iwase
2009/0287496 A1  11/2009   Thyssen et al.

OTHER PUBLICATIONS

Redline Equializer 2008-2009 112 dB MAC OS X, Windows XP/VISTA, RTAS/Audio Units?VST, 32/64 bit.*
SurferEQ v1.2, SoundRadix, 2010-2015, User Manual.*
Redline Equializer 2008-2009 112 dB MAC OS X, Windows XP/VISTA, RTAS/Audio Units, VST, 32/64 bit.*
V. Välimäki et al., "Discrete-Time Modelling of Musical Instruments", Institute of Physics Publishing, Oct. 17, 2005, pp. 1-78.
B. Bank et al., "A Modal-Based Real-Time Piano Synthesizer", IEEE Transactions on Audio Speech and Language Processing, vol. 18, No. 4, May 2010, pp. 809-821.

* cited by examiner

MUSICAL DYNAMICS ALTERATION OF SOUNDS

FIELD OF THE INVENTION

The present invention relates to a method for altering musical dynamics of a sound S as defined in the preamble of claim 1.

The present invention also relates to an arrangement for altering musical dynamics of a sound S as defined in the preamble of claim 19.

The present invention also relates to computer program.

RELATED ART AND BACKGROUND OF THE INVENTION

For electrical apparatus used for sound processing and/or for producing sounds, such as synthesizers, mixers, and electrical instruments, it is very important to be able to produce or reproduce a sound such that it is perceived as close as possible to the real sound by a listener. In the field of music, musical dynamics of a sound or a tone, originating from for example an instrument or a voice, generally refers to the perceived volume of that sound or note, i.e. to the perceived loudness or softness of that sound, which is related to the level of force having been used for creating the sound or tone, as will be described below.

A sound includes a fundamental frequency, i.e. a pitch frequency $f_p$, which is the perceived frequency of the sound. The sound may also include one or more component frequencies of the sound. The fundamental frequency $f_p$ and other component frequencies are known as partial frequencies (often denoted partials) of the sound. For some sounds, so called harmonic sounds, the one or more partial frequencies are integer multiples of the fundamental frequency $f_p$. Such additional component frequencies of harmonic sounds are known as harmonics. For example, a harmonic sound S having a pitch of $f_p$=440 Hz is a sound including a number of component frequencies $f_n = n*f_p$, where n is a positive integer. Thus the sound S includes a number of component frequencies such as 440 Hz, 880 Hz, 1320 Hz, and so on. The relative strengths of the component frequencies determine the timbre/tone of the sound S. In this example, the 440 Hz frequency component is known as the fundamental frequency.

Instruments such as e.g. a trumpet, a flute, and a violin generally produce harmonic tones. These instruments do however sound quite differently despite the fact that they have the same mutual frequency relationships for their pitch frequencies and component frequencies. The reason for these instruments sounding differently is, to a large extent, that they have different strengths of their respective component frequencies.

For some instruments/sounds, such as drum sounds, the component frequencies will typically not be integers of the fundamental frequency.

Musical dynamics is in this document defined as a measure of a level of force being perceived as having been used for producing a musical sound S or a tone. For example, for a piano tone, the musical dynamics is related to a level of force a key on the keyboard is perceived to have been pressed, where the musical dynamics is based on the character of the musical sound S or tone due to this force. Correspondingly, for a guitar, the musical dynamics is related to the level of force the guitarist is believed to have used to pluck the string on the guitar, where the musical dynamics is based on the character of the musical sound S or tone due to this force.

Correspondingly, for a drum, the musical dynamics is related to the level of force the drummer is perceived to have used to beat the membrane or body of the drum, where the musical dynamics is based on the character of the musical sound S or tone due to this force.

Also for e.g. a door closing, the musical dynamics is related to the level of force the person closing the door is perceived to have used to shut the door, where the musical dynamics is based on the character of the musical sound S or tone due to this force. A higher level of force here relates to a door being experienced to having been shut quickly and/or hard and a lower level of force relates to a door being perceived as having been shut slowly and/or softly.

As stated above, musical dynamics denotes as a measure of a level of force being perceived as having been used for producing a musical sound S or a tone, i.e. the musical dynamics is related to the perception of the timbre having been created. musical dynamics is not to be confused with the technical term signal dynamic, which is used e.g. in the fields of signal processing and acoustics. The term signal dynamic is mainly related to the amplitude and/or variation of the amplitude of the signal, and is not related to the perception of the timbre having been created. Also, musical loudness is not to be confused with the technical term loudness, which is sometimes used e.g. in home amplifiers for describing a change in frequency spectrum of a musical signal based on psycho-acoustics, which is a different type of loudness change that produces alterations of the sound that are unsuitable for the technical field of the present invention.

An alteration or change in musical dynamics for a sound means that a perceived loudness for that sound is increased or decreased, where the perceived loudness is related to a force used for creating that sound. In written musical notes, a composer can indicate the intended loudness, such as f (forte, strong/loud) or p (piano, soft), and thereby give the musician instructions on how the written notes are to be played regarding loudness.

A dynamic range includes a number of different possible levels of loudness this instrument or voice can produce, i.e. to the ability to vary the loudness of the sound being created.

Variations, such as alterations and changes, of the musical dynamics of a sound from a real instrument or a real voice change both the amplitude and the timbre of the sound. For example, an instrument being played loudly sounds brighter than when the instrument is played softly. Generally, when played softly, the instrument produces a more round tone, and when played loudly, the instrument produces a more shrill or bright tone. These differences in timbre between loudly and softly played instruments, respectively, are due to the fact that the relative amplitudes of the partials or the sound produced differ for loudly and softly played instruments.

For a softly played instrument, the frequency spectrum is usually dominated by frequency components near the pitch frequency $f_p$, i.e. the fundamental frequency, since the amplitudes of the high partials are much lower than the amplitude for partials near the fundamental frequency. However, for a loudly played instrument, the number of high partials is higher than for the softly played instrument, and the amplitudes of the high partials are higher than for a softly played instrument. The amplitudes of the high partials can even be essentially as high as, or higher than, the amplitude for the fundamental frequency $f_p$. For a listener, the sounds are perceived as being soft and as being loud, respectively.

Traditionally, to achieve different musical dynamics of a sound in electronic apparatus for sound processing, such as synthesizers, mixers and the like, the volume for a tone has simply been changed, or separate samples have been collected or produced for each level of loudness. To only change the volume results in a softer or louder sound, but also in poor sound quality, since the desired timbre variation can not be achieved. When utilizing separate samples for separate levels of loudness, e.g. for sampling a piano, samples were collected for each one of a number of loudness levels for each piano key. Basically, each piano key was pressed a number of times with differing force. It can be easily realized that the number of samples being required to achieve a tolerable dynamic range for an instrument is very large. This method therefore requires a very large number of sample collections and also a very large memory for storing these samples. It is also very difficult to sample and organize all this sound information without resulting in e.g. different piano keys and/or different touches of one piano key producing sounds being perceived as being uneven.

Another known method for altering the musical dynamics of a sound is to filter a signal containing the sound with a low pass filter (LP-filter). The LP filtering reduces the number of high partials and/or the amplitude of the high partials, which by a listener is perceived as the sound being made softer. However, the LP-filtering method results in an unrealistic timbre being produced, which is very annoying for a listener.

Shelf-filtering has also been proposed for altering the sound musical dynamics. However, the shelf-filtering solution has a problem in that it is difficult to control the filtering characteristics, such as the slope of the filter. Also, the shelf-filtering method is limited by the steepness of the slope of the filter characteristic. For example, for a biquad shelf filter, the slope is so flat that a number of filters may have to be used after each other in order to provide a steep enough slope for producing a desired timbre change. This leads to implementation complexity and/or an unrealistic timbre being produced.

Use of a large number of EQ-filters has also been proposed for altering the musical dynamics of a sound. Here, one filter was located at each one of the component frequencies being present. Thus, by the use of one filter at each component frequency, the amplitudes of the partials are directly reduced by applying a negative gain on them, thereby making the sound being perceived as softer. However, this method requires a large number of filters, which considerably adds to the system complexity. Also, if the sampling frequency is increased, or a sound having lower pitch is used, even more high partials appear in the sound, and each one of these additional partials has to be provided with a filter. Thus, a large and varying number of filters causing variable additional complexity results from this method.

As has been described above, the previously known solutions for altering musical dynamics of a sound thus provide inferior sound quality and/or systems having high complexity.

AIM AND MOST IMPORTANT FEATURES OF THE INVENTION

It is an object of the present invention to provide a method and arrangement for altering musical dynamics of a sound S that solves the above stated problem.

The present invention aims to provide a more realistic sounding and more computational efficient alteration of musical dynamics of a sound than the musical dynamics alterations known in the background art.

The object is achieved by the above mentioned method for altering musical dynamics of a sound S according to the characterizing portion of claim 1.

The object is also achieved by the above mentioned arrangement for altering musical dynamics of a sound S according to the characterizing portion of claim 19.

The method and arrangement according to the present invention are characterized in that a combined filtering and amplification of a sound signal including the sound S is performed.

A parametric equalizer, having a first gain $G_1$ and a resonance frequency $f_r$, is utilized for the filtering. There is, according to the invention, a relationship between the pitch frequency $f_p$, i.e. the fundamental frequency, of the sound S and the resonance frequency $f_r$ of the filter.

The sound signal is also amplified with a second gain $G_2$, which is dependent on the first parametric equalizer gain $G_1$, thereby creating a relationship also between the second gain $G_2$ of the amplification and the first gain $G_1$ of the parametric equalizer.

Hereby, the resulting musical dynamics alteration is perceived as sounding very realistic for a listener, why the present invention can be utilized for providing very high quality musical dynamics adjustments. Thus, by this alteration, the sound S is manipulated to be perceived as having been created with a force being lower or higher than the force it was actually created with. The sound S is in other words by signal processing manipulated, also taking the timbre of the sound S into account, to sound as if it had been created with a higher or lower force than the original force having been used for creating the sound S.

Also, only one single parametric equalizer per sound S has to be applied for altering the musical dynamics of the sound S, since the parametric equalizer according to the invention lowers the amplitude of a wide range of partials. This results in a very efficient musical dynamics alteration, causing very little increase in computational complexity.

Further, the musical dynamics of the sound S can, by using the present invention, be changed dynamically, i.e. such that the level of loudness changes during the sound S itself with a timbre for the sound S being realistically and dynamically changed as well. This is very useful when creating or processing a sound S relating e.g. to a flute, a trumpet, a voice, or the like, changing from a soft sound to a louder sound, or vice versa, during the time the sound S is presented or processed.

Also, the memory requirements and the computational complexity are very low for the present invention, since relatively few samples have to be recorded and stored in memory. Therefore, manufacturing costs can be lowered and/or more powerful and more easily playable synthesis instruments and/or sound processing devices can be produced.

According to an embodiment of the invention, the combined filtering and amplification results in decreased loudness. Hereby, the sound S is modified such that a softer sounding sound S is provided, where this softer sounding sound S, still has a very realistic tone/timbre.

The musical dynamics alteration of the embodiment of the present invention also eliminates at least one side tone being separate from a fundamental frequency $f_p$, of the sound S. Typically, more side tones are present when an instrument is played louder. For example, a side tone, which has no relation to the string of a piano, is created when a piano key is pressed with such force that the key hits the wooden bottom of the key board. This side tone is stronger when the piano is played louder than when being played softer. The side tone also includes sound components having frequencies being lower, in between, or higher than the fundamental and other partial frequencies of the instrument. All components of such a side tone are reduced by the present invention when the sound S is made softer, since the parametric equalizer has a slope for frequencies both lower and higher than the fundamental frequency $f_p$ of the sound S, whereby filtering of lower and higher frequency side tones, and also efficient filtering of side tone components between the partial frequencies of the sound S is achieved. Prior art solutions, utilizing narrow filters, have not had this advantageous effect on the side tones.

According to an embodiment of the invention, the combined such that a louder sounding sound S, still having a very realistic tone/timbre, is provided.

To be able to realistically increase and decrease the loudness, while still keeping the timbre close to a real instrument performing a corresponding musical dynamics change, is very useful in all kinds of sound creating or processing arrangements.

More in detail, according to an embodiment of the present invention, the sound S can be made to have a more round timbre in order to be perceived as having a decreased loudness by increasing the amplitude of the lower component frequencies close to the fundamental frequency, e.g. by amplifying these lower component frequencies by use of a parametric equalizer. Thereafter, this unexpected increase in amplitude is compensated for by decreasing the amplitude for essentially the whole signal spectrum by use of an essentially equal but inverted gain as for the parametric equalizer. This results in a combined transfer function, which makes the component frequencies being separate from the fundamental frequency decrease in strength along a declining transfer function curve. The slope/gradient and filter gain of the function curve can, according to the invention easily be altered in real time, from not having any effect on the component frequencies to be very steep and thus having a big effect on the sound S.

Correspondingly, the sound S can according to the present invention be made to have a more shrill timbre in order to be perceived as having a increased loudness by decreasing the amplitude of the component frequencies close to the fundamental frequency, e.g. by filtering by use of a parametric equalizer. Thereafter, this unexpected decrease in amplitude is compensated for by increasing the amplitude for essentially the whole signal spectrum by use of an essentially equal but inverted gain as for the parametric equalizer. This results in a combined transfer function, which makes the component frequencies being separate from the fundamental frequency increase in strength along an upward slope transfer function curve. The slope/gradient and filter gain of the function curve can, according to the invention easily be altered in real time, from not having any effect on the component frequencies to be very steep and thus having a big effect on the sound S.

Unlike previously known methods, the invention exploits the fact that most musical instrument sounds do not have important frequency components below the fundamental frequency. Therefore, use of a filter with a slope on both sides of the fundamental frequency produces little unwanted side effects, compared to the one-sided filters used in previously known methods. For some instruments, e.g. for a piano, these side effect are even positive, since the filtering by use of the parametric equalizer reduces low frequency component frequencies, such as component frequencies resulting from e.g. a piano key hitting the bottom of the key board.

The present invention utilizes this insight by employing the flexibility of the parametric equalizer for producing arbitrary timbre changes in musical instrument sounds, where the timbre changes ranging from very narrow band filtering, leaving essentially only the fundamental frequency $f_p$ intact, to more gentle changes of the timbre, easily can be achieved. Further, in the exceptional cases where important frequency components are located below the fundamental frequency, the increased perceived realism achieved by the invention is normally more important than the negligible side effect due to the symmetry of parametric equalizer utilized according to the present invention.

Previously known methods have focused around finding methods to alter only the important higher frequency components, but have systematically included only one-sided filtering, leaving the low frequency range intact.

Thus, according to a number of embodiments of the invention, the parametric equalizer is used in a unique inverted way to alter the perceived loudness, i.e. the musical dynamics, of a sound S, which can be an instrumental sound, a sound effect, or essentially any other kind of sound.

According to an embodiment of the invention, the resonance frequency $f_r$ of the parametric equalizer is essentially the same as the pitch frequency $f_p$ of the sound S. According to another embodiment of the invention, the resonance frequency $f_r$ of the parametric equalizer is equal to the pitch frequency $f_p$ multiplied with a second factor $k_2$.

By adjusting the resonance frequency $f_r$ of the parametric equalizer in relation to pitch frequency $f_p$ of the sound S, the timbre of the sound S can be adjusted. Also, the Q factor of the parametric equalizer determines how pointed the peak of the parametric equalizer is. Thus, the Q factor, being a well known definition, determines the bandwidth of a parametric equalizer. Therefore, by adjusting the Q factor and/or the resonance frequency $f_r$ in relation to pitch frequency $f_p$, the timbre of the sound S can be adjusted.

The tone/timbre of the sound S can thus be adjusted by adjusting filtering parameters, causing a very realistic change of the tone of the sound S. This can be performed with very little computational burden, and can be useful e.g. for making transitions between different samples of an instrument less audible.

Also, adjustments of the resonance frequency $f_r$ of the parametric equalizer can, according to this embodiment, be utilized for simulating e.g. different touch or impact positions for a drum or for an instrument string, such as a guitar string. Different positions for touching the string or hitting the drum creates different sounds S for the real instrument, e.g. hitting the drum in the centre creates a different sound from hitting it near the edge. By utilizing this embodiment of the invention, such different touch or impact positions can be simulated realistically, and with very little additional computational burden.

According to an embodiment of the invention, a higher order parametric equalizer is used for the filtering step. This higher order filter typically has a filter characteristic with a steeper or differently shaped slope than for a lower order filter, whereby another timbre is provided than for the lower order filter. The higher order filter can e.g. be a FIR filter (Finite Impulse Response filter) or an IIR filter (Infinite Impulse Response filter), and the lower order filter can e.g. be a biquad IIR filter. The filter may also be a combination of two or more filters in series with the same or different filtering parameters, producing an alternatively shaped transfer function, but with a distinct peaking within the filtering region. For the arrangement for musical dynamics altering according to the present invention, the characteristics of the filtering can easily be changed, e.g. by changing the order of the filter, without changing the rest of the method or arrangement. Thus, the arrangement of the invention is very flexible.

Detailed exemplary embodiments and advantages of the musical dynamics alteration according to the invention will now be described with reference to the appended drawings illustrating some preferred embodiments.

DETAILED DESCRIPTION OF PREFERRED EMBODIMENTS

Figure 1:
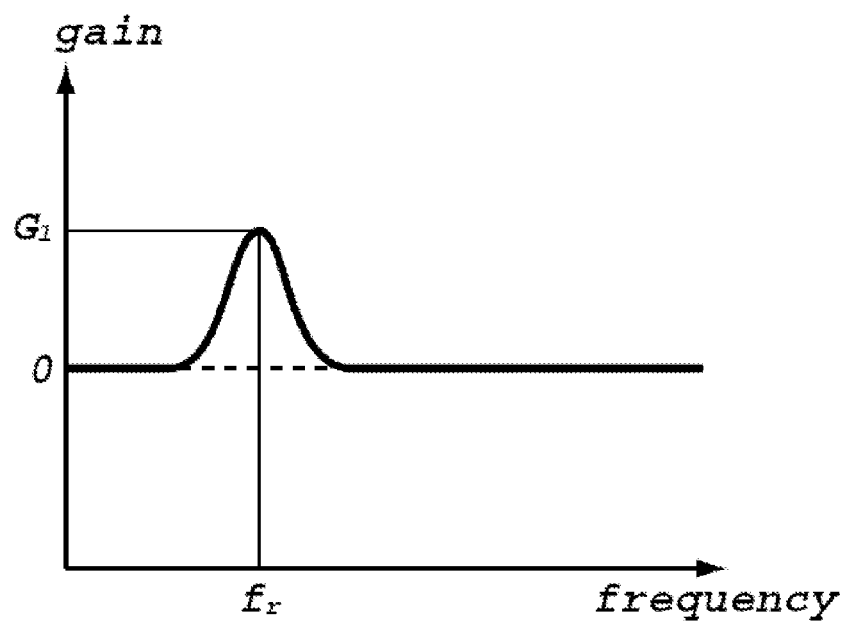
FIG. 1 schematically shows a frequency characteristic for the parametric equalizer.

The present invention presents a method and apparatus for altering musical dynamics of a sound S that can be implemented in essentially any electrical apparatus performing signal processing related to such a sound S. The sound S may be sampled from a real sound, such as a sound being provided by a real, possibly acoustic, instrument, by a person, such as a voice, or essentially any other sound source. The sound S may also be produced by an apparatus itself, e.g. by a synthesizer. In this document, the present invention will be described using the example of the sound S being a sampled instrument sound S. However, the present invention can be applied on essentially any type of sound, and is not restricted to the exemplified sound S. The sound S can here be a single tone, but can also be a mixture of different tones, such as a piano chord, or an ensemble of instruments playing different tones or the same tone in unison.

The present invention is according to an embodiment applied to such a mixture of tones. However, the invention is preferably applied to each one of the tones separately, before the tones are mixed together to a mixed sound S. This embodiment is well suited for implementation in a large number of electronic instruments of today.

According to another embodiment of the invention, the adjustment of the musical dynamics is applied to a sound S having a single essentially well defined pitch, where the loudness of this tone with the well defined pitch can be altered during the play back of the sound S.

According to an embodiment of the invention, the adjustment of the musical dynamics is applied to sound effects or other inharmonic sounds, such as drums, explosions, and the like, where the fundamental frequency can be chosen more freely.

A signal gain can be presented as a power ratio or as a logarithmic unit in decibel (dB). In this document, power ratios are denoted with the small letter "g", e.g. $g_1$, $g_2$, and the logarithmic units are denoted with the capital letter "G", e.g. $G_1$, $G_2$. Thus:

$$G_1(dB) = 20 \log_{10}(g_1) \quad \text{(Eq. 1)}$$

$$G_2(dB) = 20 \log_{10}(g_2). \quad \text{(Eq. 2)}$$

According to the present invention, a signal including the sound S is filtered by a parametric equalizer. This parametric equalizer has a first gain $G_1$ and a resonance frequency $f_r$, where the resonance frequency $f_r$ is related to a pitch frequency $f_p$ of the sound S. There is thus a relationship between the pitch frequency $f_p$, i.e. the fundamental frequency of the sound, and the resonance frequency $f_r$ of the filter.

According to the invention, the sound signal is also amplified by an amplifier. In this amplification, the sound signal is amplified with a second gain $G_2$, which is dependent on the first gain $G_1$. Thus, there is also a relationship between the second gain $G_2$ of the amplification and the first gain $G_1$ of the parametric equalizer.

Due to the combined filtering and amplification of the sound signal, where the filtering and the amplification are related to each other, a very advantageous altering of the musical dynamics is achievable.

The parametric equalizer has a filter characteristic having one peak with slopes on both sides of the peak, thereby forming an essentially bell-shaped filter characteristic.

The combination of the filtering and the amplification, according to the invention, results in a combined transfer function being essentially bell shaped in the frequency domain, and having its peak at the resonance frequency $f_r$ of the parametric equalizer. Since there is a defined relationship between the resonance frequency $f_r$ and the pitch frequency $f_p$ of the sound, the combined transfer function can be used for lowering the amplitude of the high partials of the sound. Thus, the musical dynamics of the sound can be altered such that the sound is made softer, i.e. less loud.

The parametric equalizer used according to the present invention is also known under other names, such as parametric equalization filter, EQ-filter, peak-filter, peaking band-filter, peaking equalizer, and peaking equalization filter.

The parametric equalizer is a tool that can increase or decrease the amplitudes within a chosen frequency band, and preferably includes one of more filters adapted for this purpose. The parametric equalizer generally has a centre (peak) frequency, for which the parametric equalizer has its maximal effect on the signal, and an adjustable or possibly fixed bandwidth determining the width of the frequency band within which the parametric equalizer will have a significant effect on the signal. The parametric equalizer has a well defined gain. Thus, the parametric equalizer can increase or decrease the amplitude of the signal within a selected frequency band, while leaving signal components outside of this selected frequency band essentially unaltered.

When the center frequency of the parametric equalizer is changed, the selected frequency band of the parametric equalizer is of course also changed. When the selected frequency band is changed, the number of signal components to be effected by the parametric equalizer is also changed. When the gain of the parametric equalizer is changed, the amplification of the signal components within the selected bandwidth is also changed.

The parametric equalizer used by the present invention differs from a regular bandpass or a band eliminating filter, since these regular bandpass of band eliminating filters do not have a variable gain. The parametric equalizer is also different from a notch filter, which has a totally different frequency spectrum than the parametric equalizer. The parametric equalizer is also different from a shelf/shelving filter, since the shelf filter effects the amplitude of essentially all higher frequencies or all lower frequencies, wherefore the shelf filter is unable to leave frequency components both above and below the frequencies of interest essentially unaffected in amplitude.

According to an embodiment of the present intention, the parametric equalizer comprises at least two filters being arranged in parallel and/or in series. Thus, a filter arrangement with variable gain, which may significantly increase and/or decrease the amplitude for frequencies within a limited range, leaving frequencies lower than or higher than this frequency range, or bandwidth, comparably unaffected is achieved by two or more filters according to this embodiment. This is possible since filters of arbitrary transfer function can be constructed from a multiple of filters in parallel and/or in series.

Figure 2:
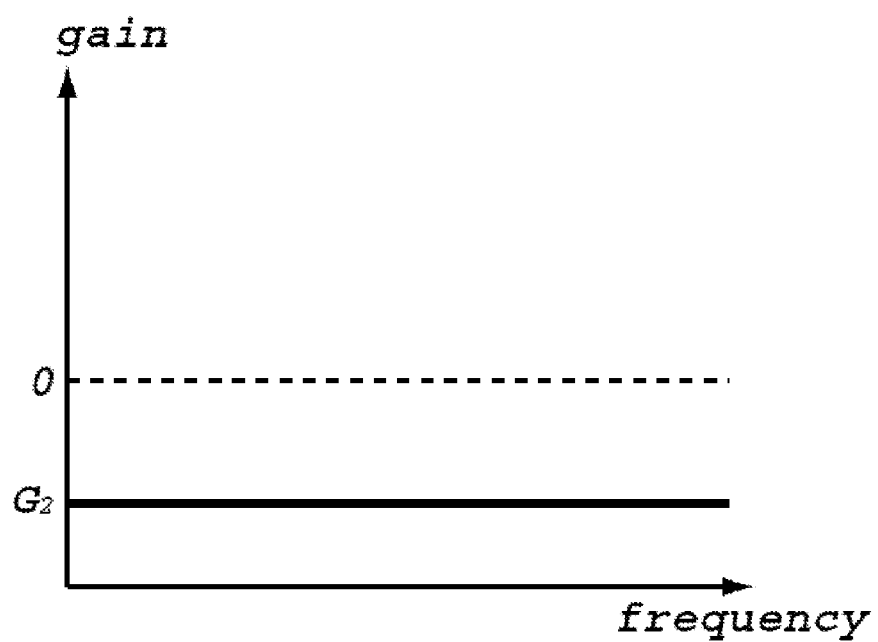
FIG. 2 schematically shows a frequency characteristic for the amplifier.
Figure 3:
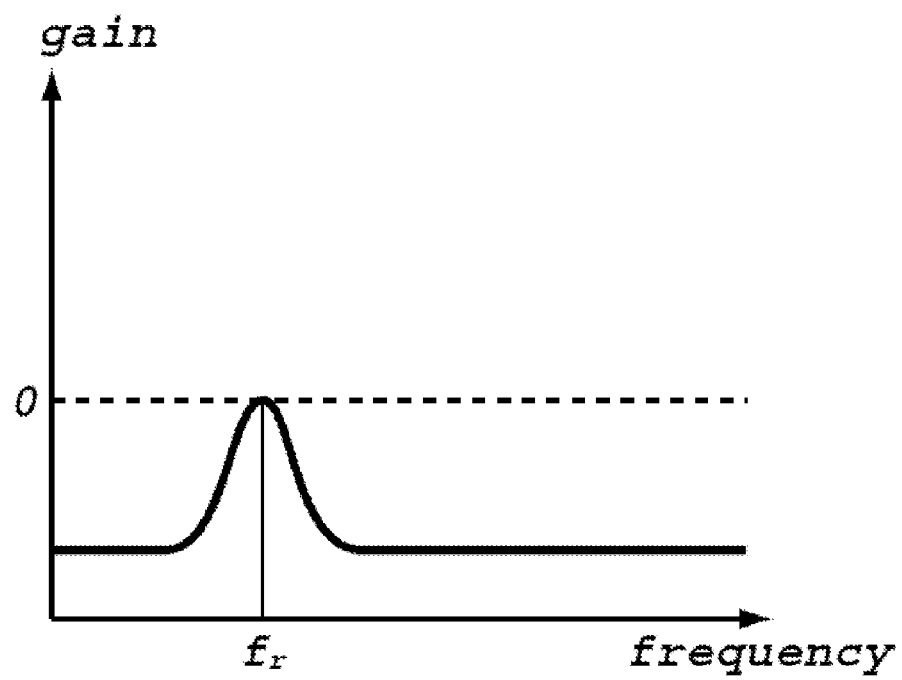
FIG. 3 schematically shows a frequency characteristic for the combination of the parametric equalizer and the amplifier.
Figure 4:
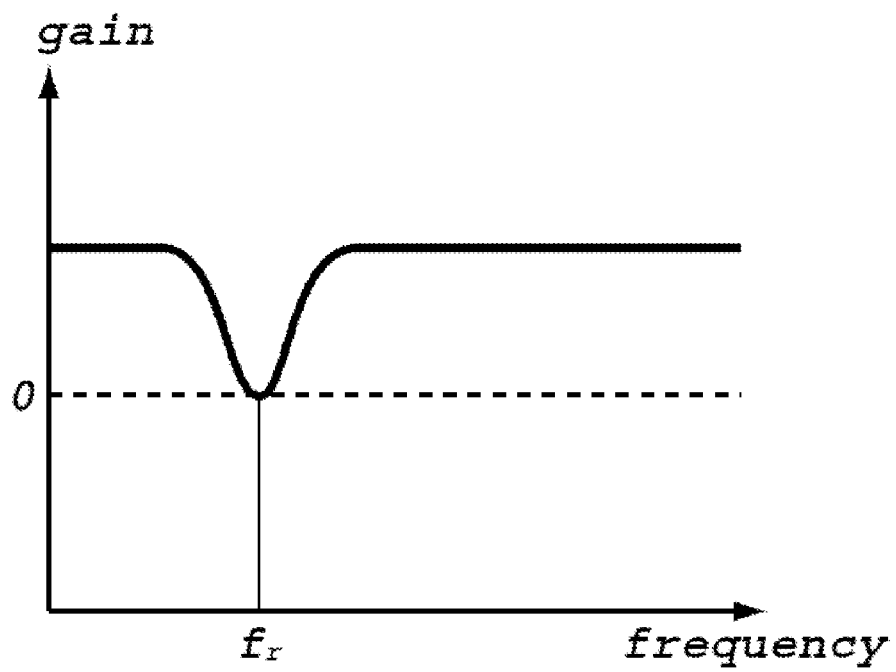
FIG. 4 schematically shows a frequency characteristic for the combination of the parametric equalizer and the amplifier.

An example of the filter characteristic of the parametric equalizer filtering and the characteristic of the amplifier amplification are schematically shown in FIGS. 1 and 2, respectively. FIG. 3 schematically shows an example of a resulting combined transfer function for the filtering and amplification according to the invention. When utilizing the shown non-limiting schematic example of the transfer function of FIG. 3, the musical dynamics is altered such that the timbre of the sound is made to be perceived as softer. As will be described below, a combined transfer function resulting in an alteration making the timbre of the sound perceived as louder has another characteristic, i.e. shape. Such a combined transfer function is shown in FIG. 4.

The present invention has a number of advantages. One such advantage is that the alteration in musical dynamics resulting from using the method is perceived as sounding very realistic for a listener. Previously known methods for musical dynamics alteration by e.g. modulating the cutoff frequency for a used filter are usually perceived as a synthetic sweeping, which does not sound very realistic for a listener.

One other advantage is that only one single parametric equalizer per sound S has to be applied for altering the musical dynamics of the sound S. Thus, since the parametric equalizer according to the invention lowers the amplitude of all important partials, only one parametric equalizer per sound, i.e. only one parametric equalizer per pitch frequency $f_p$, has to be used. This lowers the computational complexity considerably in comparison with known methods that apply one filter per component frequency, resulting in a large number of filters being used and therefore also a large number of filter computations having to be performed. Also, for the known methods using multiple filters per sound, the number of filters per sound increases with increasing sampling frequency, since more component frequencies, which each has to be provided with filters, appear for the sound when the sampling frequency increases.

As stated above, only one parametric equalizer has to be utilized for altering the musical dynamics according to the present invention. However, more than one parametric equalizer can be utilized also for the present invention, which can be useful in some implementations.

Another advantage with the present invention is that the parametric equalizer and the amplification easily can be swept from one resulting dynamic level to another resulting dynamic level for the sound S. Therefore, the musical dynamics of the sound S can be changed dynamically by the invention. Thus, the musical dynamics of a sound S can be changed during the sound S itself, such that the level of loudness changes during the sound with a timbre for the sound S being realistically and dynamically changed as well. This makes it possible to realistically have the sound S changing from a soft sound to a louder sound during the time the sound S is presented or created, which is an important feature for sound processing of a large number of instruments, such as a trumpet, a flute, or the like, or of a voice. This dynamic alteration of the musical dynamics can be used for providing a naturally sounding envelope for the sound S.

Often, electronic musical instruments employs an envelope generator that controls the amplitude of the sound S during the stages of playback of the sound S. Often, an envelope of type ADSR (Attack/Decay/Sustain/Release) is used for providing a naturally sounding attack of the sound S, and a naturally sounding "tail" of the sound S if the sound is to be interrupted while being played, e.g. if a key is released before the whole tone has been played back. Thus, the envelope generator provides information on how the musical dynamics may vary during the sound S.

For example, the envelope can here be made to have one or more tones gradually increase or decrease in strength during the time the one or more tones are presented (played back). The envelope can also determine how fast the one or more tones should die away when a user e.g. lets go of a key. The envelope can be seen as a function which continuously adjusts the loudness of the sound S when it is played back. In this document, the term envelope is used for describing a parameter at least partly controlling the musical dynamics envelope of the sound S. An envelope can include essentially any shape and any number of stages. However, the well-known ADSR envelope, having envelope curves for the playback stages attack, decay, sustain and release, is the predominating type of envelope used in almost all existing electronic musical instruments today.

In prior art, these envelopes normally only performs a simple control of the amplitude of the signal, which result in an ending of the tone playback sounding very unnatural, since for natural instruments the high partials decline faster than the fundamental. Therefore, samplings dedicated only for tone endings are utilized, so called release samplings, which increase the demand for memory storage and complexity, and also produce unwanted sound artifacts due to overlapping samplings.

Figure 5:
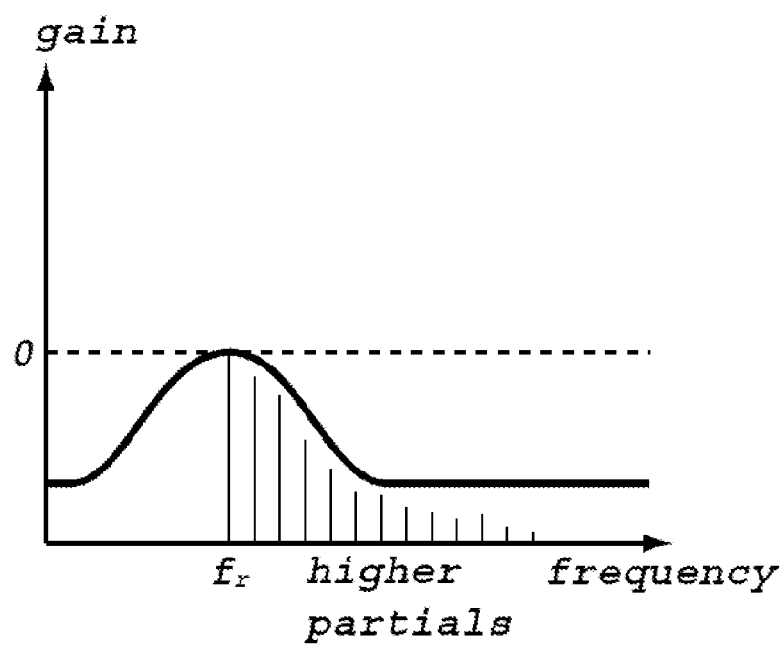
FIG. 5 schematically shows a frequency characteristic, including schematically illustrated examples of partials, for the combination of the parametric equalizer and the amplifier.
Figure 6:
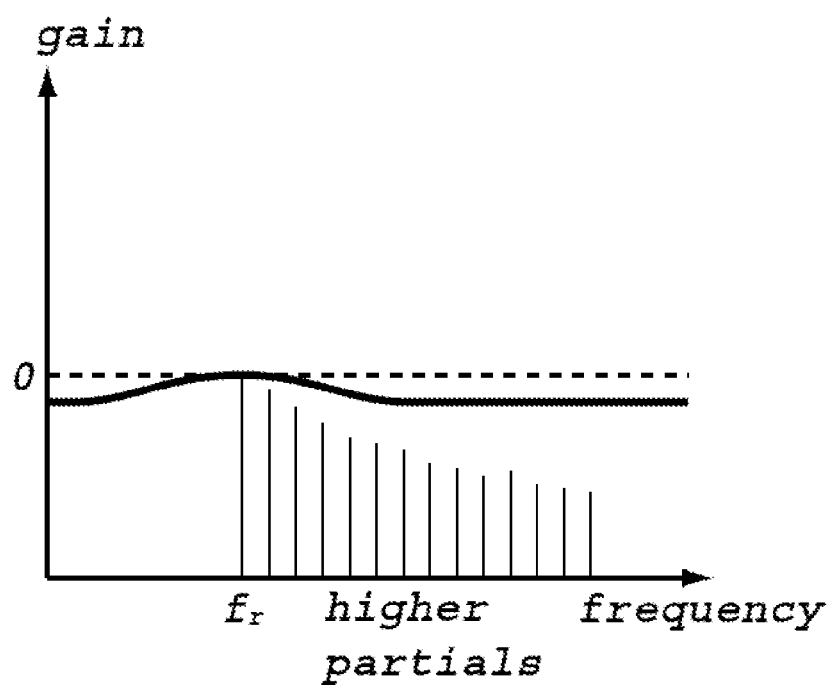
FIG. 6 schematically shows a frequency characteristic, including schematically illustrated examples of partials, for the combination of the parametric equalizer and the amplifier.

As was described above in connection with FIG. 3, a resulting combined transfer function for the filtering and amplification according to the invention can alter the musical dynamics such that the timbre of the sound is made to have a more round timbre, which will be perceived as being softer, i.e. as having a decreased loudness. As is schematically illustrated in FIGS. 5 and 6, this is according to the present invention achieved by increasing the amplitude of the lower component frequencies, i.e. the component frequencies close to the resonance frequency $f_r$, e.g. by amplifying these lower component frequencies by use of a parametric equalizer. Thereafter, this increase in amplitude is compensated for by decreasing the amplitude for essentially the whole signal spectrum by use of an essentially equal but inverted gain as for the parametric equalizer. This results in a combined transfer function, which makes the component frequencies (partials) being separate from the fundamental frequency decrease in strength along a declining transfer function curve.

Non-limiting schematically examples of a number of such partials having frequencies being equal to and higher than the resonance frequency $f_r$ and declining in amplitude along the transfer function, are shown in FIG. 5, for a steep transfer function including a parametric equalizer with a high gain $G_1$, and in FIG. 6, for a much less steep transfer function including a parametric equalizer with a relatively small gain $G_1$. As is understood by a skilled person, the slope/gradient and filter gain included in the transfer function curve of FIG. 5 has a relatively big effect on the sound S, whereas the slope/gradient and filter gain included in the transfer function curve of FIG. 6 has a much less effect on the sound S.

Figure 7:
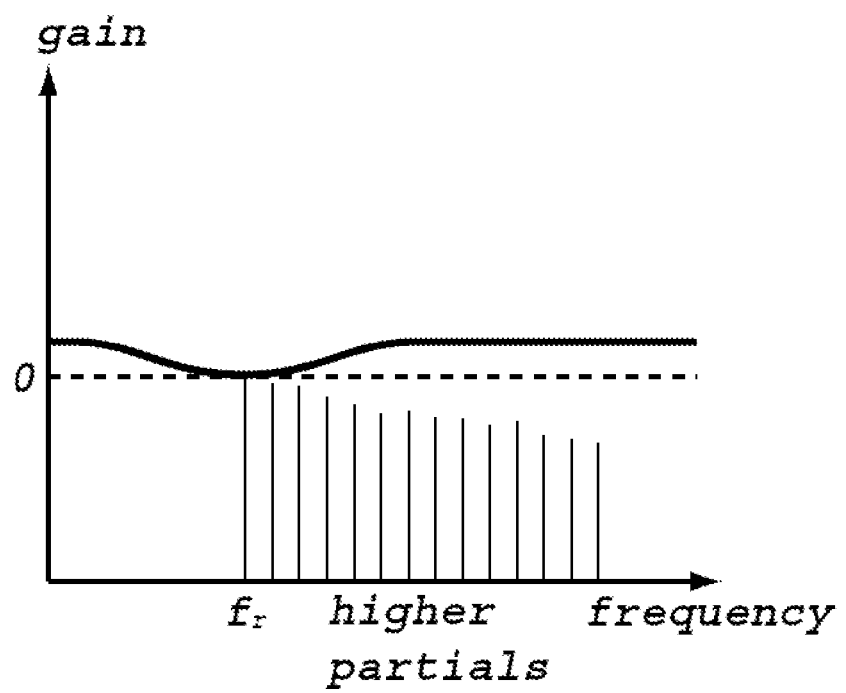
FIG. 7 schematically shows a frequency characteristic, including schematically illustrated examples of partials, for the combination of the parametric equalizer and the amplifier.

FIG. 7 is a non-limiting example of a schematically illustrated combined transfer function resulting in an alteration making the timbre of the sound perceived as louder, in which the higher partials are also schematically included. Here, the sound S is made to have a more shrill timbre in order to be perceived as having a increased loudness. This is achieved by decreasing the amplitude of the component frequencies close to the fundamental frequency, e.g. by filtering by use of a parametric equalizer. Thereafter, this decrease in amplitude is compensated for by increasing the amplitude for essentially the whole signal spectrum by use of an essentially equal but inverted gain as for the parametric equalizer. This results in a combined transfer function, which causes the component frequencies (partials) being separate from the resonance frequency $f_r$ to have higher amplitudes, and also to have slower declining amplitudes, than the partials schematically illustrated in FIGS. 5 and 6. This can easily be seen in these figures if the amplitude of the respective partials are compared with the dashed lines for gain=0 in each figure. Also, the combined transfer function shown in FIG. 7 is positive, i.e. above gain=0, throughout the spectrum. The slope/gradient and filter gain of the function curve can determined how much effect this will have on the sound S, from not having any effect on the component frequencies to be very steep and thus having a big effect on the sound S.

As is understood by a skilled person, corresponding partials having frequencies being lower than the resonance frequency $f_r$ can also be present, but has been omitted in FIGS. 5-7 to make these figures clear, since the higher partials are more important for the invention.

According to an embodiment of the invention, the envelope can be utilized in combination with the dynamically changing loudness of the sound S according to the invention.

Essentially without adding to the complexity, according to the embodiment, the release stage of the envelope is combined with the gradual decline of the perceived timbral loudness of the sound S used through filtering by the present invention. Thereby, a much more natural sounding ending of the tone playback is achieved.

According to an embodiment of the present invention, a corresponding combination of the attack stage of the envelope and the dynamically changing loudness of the sound S according to the invention is applicable for creating natural sounding attacks. The more realistic sounding attacks of sounds S are here achieved by combining the attack stage of the envelope with the change of perceived timbral loudness according to the present invention.

In previously known systems, having different samples for each dynamic level of each sound, it is very difficult to perform such changes of the dynamic level with accompanying timbre changes during the sound itself.

Also, since the present invention utilizes filtering in combination with amplification instead of a very large number of samplings in a number of dynamic levels for each sound, the memory requirements and the computational complexity is considerably lowered by using the present invention, since fewer samples have to be recorded and stored in memory. Therefore, the invention can make manufacturing of electronic or synthetic instruments and/or sound processing devices less costly. These electronic or synthesis instruments and/or sound processing devices can also be made more powerful and easy to play and/or use.

Also, the invention can be used for evening out gaps between dynamic levels in sample-based musical instruments. Typically, sample-based musical instruments are sampled with two or more dynamic levels. Thus, two or more sounds having the same pitch, but varying loudness and timbre, are collected to represent a given note of the recorded instrument. Unless a very large number of dynamic levels are used for this sampling, the transitions between these samples will be audible and disturbing for the operator of the instrument. However, by modifying the loudness of the samples, by utilizing the present invention, these transitions can be made less audible, by filling in the gaps in the dynamic range of the note, thereby making the musical instrument more powerful and easy to play and/or use, at the same time as keeping the advantages of the sample-based musical instruments.

Further, the invention can be used as a complement when artificially changing the pitch of a sound, for producing a more realistic timbre. Generally, higher pitched sounds have weaker high partials, and lower pitched sounds have stronger high partials. Traditional artificial pitch-shifting does not take this into account, which results in a distorted timbre when changing the pitch. By utilization of the present invention, the loudness of the sound during the pitch-shifting can also be changed, whereby the timbre of the pitch-shifted sound can be made to sound more realistic, by decreasing the perceived loudness at the same time as the pitch is shifted upwards for decreasing the amplitude of high component frequencies, or by increasing the perceived loudness at the same time as the pitch is shifted downwards for increasing the amplitude of high component frequencies.

Also, the present invention can be used for evening out the gaps between samples of different pitches of sample-based musical instruments. Often, sample-based musical instruments are not sampled with halftone accuracy, but in larger intervals such as sampling only one note per octave. The gaps between sampled notes are filled in by artificially pitch-shifting said samples. Unless a very large number of closely pitched samples are collected, the transitions between these samples will be audible and disturbing for the operator of the instrument, and the timbre will sound unrealistic for sounds that are produced by pitch-shifting a differently pitched sample. By utilizing the present invention for modifying the loudness, and thus the timbre, of the samples during pitch-shifting, the transitions between these notes can be made less audible, thereby making the musical instrument more powerful and easy to play and/or use.

According to an embodiment of the invention, the second gain $G_2$, i.e. the second gain $G_2$ of the amplifier performing the amplification, has a value being essentially equal to an inverse of the first gain $G_1$ i.e. being essentially equal to an inverse of the gain $G_1$ of the parametric equalizer. Thus, $G_2=-G_1$. By this determination of the second gain $G_2$ of the amplifier, the amplifier applies a second gain $G_2$ being inverted to the gain $G_1$ for the peak of the parametric equalizer. For example, if the parametric equalizer increases the amplitude of the signal with 6 dB at the peak of the parametric equalizer, then the amplifier decreases the amplitude of the signal by 6 dB, i.e. the first gain $G_1$ is 6 dB and the second gain $G_2$ is –6 dB. The combined characteristic for the filtering combined with the amplification will then result in a signal having essentially unchanged amplitude at the frequencies around the peak of the parametric equalizer, but having lowered amplitude for all other frequencies. Thus, this embodiment leaves the amplitudes for frequencies around the peak of the parametric equalizer relatively unchanged, but changes the amplitudes of the other frequencies, such as harmonic frequencies, thereby altering the musical dynamics of the sound S.

According to an embodiment of the invention, the second gain $G_2$, i.e. the second gain $G_2$ of the amplifier performing the amplification, has a value being equal to an inverse of the first gain $G_1$ of the parametric equalizer multiplied with a first factor $k_1$. Thus, $G_2=-k_1*G_1$.

Here, the second gain $G_2$ can be arranged to have a value being slightly different from the inverse of the first gain $G_1$. Hereby, also the strength of the pitch frequency $f_p$ of the sound S can be altered to be louder or softer. This can be useful for also lowering the amplitude of the pitch frequency $f_p$ when decreasing the loudness of the sound S, which makes the loudness decrease of sound S more similar to a real decrease. In real life, all component frequencies and also the pitch frequency are decreased when the loudness is decreased. However, the component frequencies decrease much faster than the pitch frequency, which also results in a change in timbre. According to the embodiment, the change in loudness results in a combined change in loudness and timbre, which is very natural sounding.

According to an embodiment of the invention, the first gain $G_1$ of the parametric equalizer has a positive value, i.e. $G_1>0$. Thus, the parametric equalizer performs a positive amplification of the signal, at least around the resonance frequency $f_r$ of the parametric equalizer. The amplifier then applies the second gain $G_2$ to the signal, where the second gain results in a negative amplification of the signal according to $G_2=-G_1$ or $G_2=-k_1*G_1$ as described above. Thereby, the resulting total alteration of the musical dynamics of the signal is then by a listener perceived as the sound S being made softer. This embodiment is schematically shown in FIGS. 1-3 and 5-6.

According to an embodiment of the invention, the first gain $G_1$ of the parametric equalizer has a value being negative, i.e. $G_1<0$. Thus, the parametric equalizer performs a negative amplification of the signal around the resonance frequency $f_r$ of the parametric equalizer. The filter characteristic for the parametric equalizer here has the shape of a valley having its lowest point in the resonance frequency $f_r$. The amplifier then applies the second gain $G_2$ to the signal, where the second gain $G_2$ results in a positive amplification of the signal according to $G_2=-G_1$ or $G_2=-k_1*G_1$ as described above. Thereby, the resulting total alteration of the musical dynamics of the signal is then by a listener perceived as the sound S being made louder. This embodiment is schematically shown in FIGS. 4 and 7.

As described above, both musical dynamics alterations resulting in a softer or a louder sound S can be achieved easily, smoothly, and dynamically according to the invention. To adjust the alteration in musical dynamics is very easily performed since only a couple of easily adjusted parameters, such as the first gain $G_1$ and the second gain $G_2$, have to be adjusted. These adjustments can be easily performed by a player or operator playing or operating an instrument and/or sound processing device. These adjustments can of course also be at least partly controlled by the instrument and/or sound processing device itself, such as when envelope processing is utilized. This is described more in detail below.

According to an embodiment of the invention, the first gain $G_1$ of the parametric equalizer has an adaptive value. Also, since the second gain $G_2$ of the amplifier has a relationship to, and is dependent on, the first gain $G_1$, also the second gain $G_2$ is adaptive. Hereby, very flexible musical dynamics alterations are made possible.

Also, according to an embodiment of the invention, the Q factor for the parametric equalizer and/or the resonance frequency $f_r$ for the parametric equalizer have adaptive values that can be changed in real time. This can be useful e.g. for also dynamically changing the slope together with the musical dynamics.

According to an embodiment of the invention, at least one of the first gain $G_1$, the Q factor, and the resonance frequency $f_r$ is changed at least partially randomly. Thus, the adaption is here performed by utilization of some kind of random parameter. This influence of chance in the adaption procedure creates a variation in the timbre for the sound S, which is very advantageous in some situations.

The second gain $G_2$ for the amplifier has, according to an embodiment of the invention, a value being essentially equal over frequencies being important for the sound S. This can also be seen in FIG. 2. Due to this shape of the amplifier gain, offering an essentially equal amplification for all frequencies having an impact on the perception of the sound S, the combined characteristics for the parametric equalizer and the amplifier has a shape being very suitable to altering musical dynamics of the sound S.

As described above, the filtering step of the invention can be performed before the amplifying step. Thus, the signal including the sound S is here first filtered by the parametric equalizer and is then amplified by the amplifier.

However, the amplification step can, according to an embodiment of the invention, also be performed before the filtering step, which can be advantageous for some implementations.

Generally, depending on the architecture and performance of the sound processing apparatus or instrument, and on the parametric equalizer used, the order in which filtering and amplification are to be performed can be chosen. When floating point calculations are used, either of the filtering step or amplification step can be performed first in most cases, since there is normally plenty of calculation head room.

When fixed point or integer calculations are used, having very little calculation head room, there are scenarios for which a negative amplification by the amplification step should be performed before the filtering step, since no calculations can use values being larger than a limit being fixed in relation to the number of bits used. E.g., for 16 bits fixed point calculations, the highest usable value is +32767. For 8 bits fixed point calculations, the highest usable value is +127. Due to these limitations, it can be advantageous to first perform the amplification step first and then the filtering step to stay within these limits for usable values.

For some implementations, the filtering and amplifying steps can be performed in a single step, e.g. by modifying certain filter parameters to have the filter also perform the amplification of the sound. For some implementations this may be advantageous in one or several ways, e.g. resulting in higher computational efficiency, filter stability, numeric accuracy and/or lowering requirements on calculation head room. This embodiment of the invention is described in more detail below.

According to an embodiment of the invention, the resonance frequency $f_r$ of the parametric equalizer is essentially the same as the pitch frequency $f_p$ of the sound S, i.e. $f_r=f_p$.

According to another embodiment of the invention, the resonance frequency $f_r$ of the parametric equalizer is equal to the pitch frequency $f_p$ multiplied with a second factor $k_2$, i.e. $f_r=k_2*f_p$.

The resonance frequency $f_r$ of the parametric equalizer normally follows the pitch frequency $f_p$, but can also be set so divert more or less from the pitch frequency $f_p$ by the use of the second factor $k_2$. By adjusting the resonance frequency $f_r$ of the parametric equalizer in relation to pitch frequency $f_p$ of the sound S, the timbre of the sound S can be adjusted. For example, if the second factor $k_2$ is set to the value two (2), the first harmonic having a frequency of $2*f_p$ will be more outstanding than the pitch frequency $f_p$ when the sound S is rather soft, since the peak of the parametric equalizer is located at the first harmonic frequency $2*f_p$. Also, this shifting of the resonance frequency $f_r$ in relation to the pitch frequency $f_p$ can be utilized in combination of an adjustment in the Q factor for the parametric equalizer in order to achieve a wanted timbre. The Q factor determines how pointed the peak of the parametric equalizer is, where higher Q factors results in a more pointed peak, i.e. a smaller bandwidth, than lower Q factors.

Thus, a shift of the resonance frequency $f_r$ of the parametric equalizer in relation to the pitch frequency $f_p$ of the sound S can be utilized for controlling the tone of the sound S. This is very useful for sounds S including certain instruments.

The adjustment of one or more of the resonance frequency $f_r$, the Q factor, and the first gain $G_1$ is, according to an embodiment of the invention, made based on one or more secondary parameters, where these one or more secondary parameters also can have an effect on the musical dynamics of the sound S. These one or more secondary parameters can for example include one or more of the envelope mentioned above, the pitch frequency $f_p$ of the sound S, and a velocity, where the velocity is related to the force being used for pressing or operating e.g. a key, a pedal, a slider, a ribbon controller, a breath controller, or any other input interface arrangement when creating or playing back the sound S.

In this document, the term velocity will be used for describing a parameter controlling the dynamic level of a sound, which is controlled partly of fully by the operator of the musical instrument, regardless of whether the value is controllable only at key onset, or dynamically throughout the playback of the sound by the use of a continuous controller, such as a pedal, a slider, a ribbon controller or a breath controller.

The first gain $G_1$, and thus also the second gain $G_2$, can be determined based on the envelope and the velocity, as will be described in the following non-limiting example. The velocity parameter can here be assumed to have a value between 0 and 1, depending on the force being applied by the operator of the instrument using the input interface. The envelope is an at least partly automated exemplified envelope curve for the musical dynamics, which varies in amplitude during the sound S. The envelope can here be assumed to have a value between 0 and 1.

The envelope can be multiplied with the velocity when determining a suitable value for the first gain $G_1$. Also, to achieve a pitch-dependent timbre variation, the product of the envelope and the velocity can be further multiplied with a half tone constant $C_h$ for each half tone the pitch frequency is increased, and, correspondingly, be divided by a half tone constant $C_h$ each half tone the pitch frequency is decreased.

This half tone constant $C_h$ can for example have a value of 0.9, but is not limited to this value.

Further, the product of the envelope, the velocity and the half tone constant $C_h$ can also be multiplied with a scaling constant $C_1$, where the scaling constant $C_1$ determines how much the parametric equalizer should decrease the musical dynamics when the velocity has a value being zero (0). When determining the first gain $G_1$, a constant $C_2$ can also be added to the resulting gain to give the first gain $G_1$ a value such that the sound S can be made louder than originally.

This can also be expressed as:

$$G_1 = C_2 - C_1(1-\text{velocity}*\text{envelope}*(C_h)^{n_{ht}}), \quad \text{(Eq. 3)}$$

where $n_{ht}$ can be any real integer or non-integer value, and denotes the number of half tones the playback pitch differs from the original pitch, i.e. the possible shift in frequency which is performed on the sound S. in practical implementations. $n_{ht}$ usually has a value in the interval between −128 and 128, since this interval covers essentially all tones an instrument should be able to play due to the human audible frequency bandwidth.

As was stated above, equation 3 only shows one of a number of possible embodiments, where these possible embodiments have the feature in common that they determine the first gain $G_1$ based on secondary parameters such as one or more of the velocity, the envelope, and the pitch of the sound S. Hereby, an efficient and correct determination of the first gain $G_1$ can be achieved.

Generally expressed, the first gain $G_1$ of the parametric equalizer thus depends on a number parameters $p_1$, $p_2, \ldots, p_n$, i.e.:

$$G_1 = \text{function}(p_1, p_2, \ldots, p_n), \quad \text{(Eq. 4)}$$

where each one of these parameters is either at least partly automated or at least partly controllable by a person using a musical dynamics alteration arrangement, or is at least partly are controlled by a control unit controlling the arrangement. These parameters can, according to different embodiments, be multiplicative or additive.

More specifically, a dynamically varying timbre can be achieved by utilizing the envelope and the velocity for determining the first gain $G_1$. As stated above, the envelope value determines how the musical dynamics of the sound S shall change during the sound S, e.g. if it should fade away or be given a crescendo at the same time as having different dynamic levels. According to two embodiments of the invention, the first gain $G_1$ is determined as:

$$G_1 = -(\text{base\_level} + \text{dynamic\_range}*(\text{velocity}*\text{envelope})) \quad \text{(Eq. 5)}$$

or as:

$$G_1 = -(\text{base\_level} + \text{dynamic\_range}*(\text{velocity} + \text{envelope})/2), \quad \text{(Eq. 6)}$$

where:
  base_level is the lowest allowable dynamic level, e.g. −60 dB;
  dynamic_range is the dynamic range of the sound S, e.g. 80 dB (e.g. from −60 dB to +20 dB);
  velocity is the force, having a value between zero (0) and one (1), which can dynamically be altered by a user through an interface, such as a key, a pedal, a slider, or the force of a touch of a key; and envelope is the at least partly automated amplitude envelope of the sound S, having a value between zero (0) and one (1), and being varied during the sound S.

In equations 5 and 6, minus signs have been added to the equations to indicate that, according to the invention, a positive change in loudness of a sound would typically result in a negative filter gain $G_1$, and a negative change in loudness of a sound S would typically result in a positive filter gain $G_1$.

Thus, equations 5 and 6 can be utilized for relating the musical dynamics alteration to the envelope and the velocity, which is often very useful.

According to an embodiment of the invention, the resonance frequency $f_r$ of the equalizer filter is adjusted based on an impact position for e.g. a drum or for an instrument string. Different positions for touching the string or hitting the drum creates different sounds S for the real instrument, which can be realistically simulated by this embodiment of the invention. Here, the resonance frequency $f_r$ is varied with the impact position, which is provided by some kind of input interface, e.g. a MIDI (Musical Instrument Digital Interface) drum. By shifting the resonance frequency $f_r$, one other frequency is chosen, by the chosen resonance frequency $f_r$, to be a new fundamental frequency based on the impact position of on the drum or string, which determines how the timbre of the sound S should change if the loudness of the sound S is to be changed.

According to an embodiment of the invention, the sound S is a combination of at least two sounds $S_k$, where k=1, 2, ... N. Thus, two or more sounds $S_k$ are here combined to form the sound S. This can be the case e.g. when a number of superposed sounds $S_k$ are processed as a group sound S, for instance for instruments having multiple samples in multiple layers, or having one or more parallel sounds for envelope stage transitions, or other sound transitions, being interpolated into each other, and having essentially the same pitch. Since they have essentially the same pitch they can be processed together as a combined sound S.

Thus, for multiple sounds $S_k$ having essentially the same pitch, or being pitch-shifted to have essentially the same playback pitch, and at least occasionally being presented simultaneously, such as e.g. layered sounds $S_k$, these multiple sounds $S_k$ can be processed together as a combined sound S, which of course lowers the computational complexity of the system.

According to an embodiment of the present invention, the parametric equalizer includes at least two cascaded parametric equalizers. Hereby, a higher order filter characteristic, and also other shapes of the filter characteristics, can be achieved. The number of cascaded filters used is chosen based on the preferred filter characteristics.

According to an embodiment of the invention, the filtering and the amplification are performed simultaneously in one step by the parametric equalizer. Here, one or more filtering coefficients may for example be pre-multiplied with the power ratio value $g_2$ of the second gain, which is the power ratio equivalent of the logarithmic value $G_2$ of the second gain, such that filtering with these "amplified" filtering coefficients also infers an amplification at the same time as the filtering is performed.

For example, if the parametric equalizer is second order recursive linear IIR-filter having two poles and two zeros, i.e. a digital biquad filter, having an input signal $x_n$ before filtering and an output signal $y_n$ after filtering, the output signal $y_n$ can be described as:

$$y_n = a_0 * x_n + a_1 * x_{n-1} + a_2 * x_{n-2} + b_1 * y_{n-1} + b_2 * y_{n-2} \quad \text{(Eq. 7)},$$

where $a_0$, $a_1$, $a_2$, $b_1$, $b_2$ are coefficients of the digital biquad filter, an n is a current time index for input values $x_i$ and output values $y_i$ of the discrete time signal.

Then, the input coefficients $a_0$, $a_1$, $a_2$ can be pre-multiplied with the power ration value $g_2$, being the power ratio equivalent to the logarithmic second gain $G_2$, whereby amplification with the second gain $G_2$ is performed by the parametric equalizer. In this example, the amplification is technically performed before the filtering step, by making the amplification a part of the input coefficients of the parametric equalizer.

The different steps of the method of the invention described above can be combined or performed in any suitable order. A condition for this of course, is that the requirements of a step, to be used in conjunction with another step of the method of the invention, in terms of available measures, must be fulfilled.

The method of the invention can be implemented in a computer program, having code means, which when run in a computer causes the computer to execute the steps of the method. The computer program can be included in a computer readable medium of a computer program product. The computer readable medium may consist of essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

According to an aspect of the present invention, an arrangement for altering musical dynamics of a sound S included in a sound signal is presented. This arrangement includes a parametric equalizer being arranged for filtering the sound signal. This parametric equalizer has a first gain $G_1$ for the peak of the parametric equalizer characteristic. The parametric equalizer also has a resonance frequency $f_r$, which is related a pitch frequency $f_p$ of the sound S. The arrangement further includes an amplifier, which is arranged for amplifying the sound signal with a second gain $G_2$, where the second gain $G_2$ is dependent on the first gain $G_1$. Thus, the arrangement for altering musical dynamics of the sound S is arranged for performing the above described method of the invention. The arrangement can further be adapted to perform all embodiments of the invention, as described above.

The second amplifier gain $G_2$ can have a value being essentially equal to an inverse of the first parametric equalizer gain $G_1$, $G_2 = -G_1$, or can also have a value being equal to an inverse of the first parametric equalizer gain $G_1$ multiplied with a first factor $k_1$, $G_2 = -k_1 * G_1$. By adjusting the second amplifier gain $G_2$ to have different values, a desired timbre can be achieved for the sound S.

The first parametric equalizer gain $G_1$ can have a value being positive, $G_1 > 0$. This results in decreased musical dynamics, i.e. in the sound S being perceived as being made softer.

However, the first parametric equalizer gain $G_1$ can also have a value being negative, $G_1 < 0$. This results in increased musical dynamics, i.e. in the sound S being perceived as being made louder.

Thus, depending on the choice of the value of the first parametric equalizer gain $G_1$, which also effects the value of the second amplifier gain $G_2$, the alteration of the musical dynamics can easily be chosen according to the invention, such that both a softer and a louder sound S may be produced.

The first parametric equalizer gain $G_1$, the frequency $f_r$, and the Q factor can also have an adaptive value, which also can be dynamically changed, such that adjustments of the musical dynamics alteration can be quickly and easily performed by e.g. a musician playing an instrument or by an operator operating a sound processing apparatus, even during a sound S is being played or processed.

The resonance frequency $f_r$ of the parametric equalizer can also be utilized for changing the timbre of the sound S. Differing timbres are created by choosing this resonance frequency $f_r$ equal to or almost equal to the pitch frequency $f_p$ of the sound S, which can be utilized for creating a realistic tone.

The methods and arrangements for sound musical dynamics altering according to the invention may be modified by those skilled in the art, as compared to the exemplary embodiments described above.

As is obvious for a skilled person, a number of other implementations, modifications, variations and/or additions can be made to the above described exemplary embodiments. It is to be understood that the invention includes all such other implementations, modifications, variations and/or additions which fall within the scope of the claims.

The invention claimed is:

1. A Method for altering musical dynamics of a sound (S) included in a sound signal, said method comprising the steps of: —filtering said sound signal by the use of a parametric equalizer, said parametric equalizer having a first gain ($G_1$) and a resonance frequency (fr) varying in relation to a pitch frequency (f) of said sound (S); and —amplifying said sound signal with a second gain ($G_2$), said second gain ($G_2$) being dependent on said first gain ($G_1$).

2. Method as claimed in claim 1, wherein said second gain ($G_2$) has a value being essentially equal to an inverse of said first gain ($G_1$), $G_2=-G_1$.

3. Method as claimed in claim 1, wherein said second gain ($G_2$) has a value being equal to an inverse of said first gain ($G_1$) being multiplied with a first factor ($k_1$), $G_2=-k_1*G_1$.

4. Method as claimed in claim 1, wherein said first gain ($G_1$) has a value being positive, $G_1>0$, thereby resulting in a loudness for said sound (S) being decreased.

5. Method as claimed in claim 1, wherein said first gain ($G_1$) has a value being negative, $G_1<0$, thereby resulting in a loudness for said sound (S) being increased.

6. Method as claimed in claim 1, wherein said filtering step is performed before said amplifying step.

7. Method as claimed in claim 1, wherein said pitch frequency ($f_p$) equals said resonance frequency ($f_x$), $f_x=f_p$.

8. Method as claimed in claim 1, wherein said resonance frequency ($f_x$) is equal to said pitch frequency ($f_p$) multiplied with a second factor ($k_2$), $f_r=k_2*f_p$.

9. Method as claimed in claim 1, wherein said parametric equalizer has an adaptive value for at least one parameter in the group of:
said first gain ($G_1$)
said resonance frequency ($f_x$), and
a Q factor.

10. Method as claimed in claim 9, wherein said at least one parameter is varied at least partly randomly.

11. Method as claimed in claim 1, wherein said second gain ($G_2$) has a value being essentially equal over frequencies being included in said sound (S).

12. Method as claimed in claim 1, wherein said altering of said musical dynamics is performed dynamically during said sound (S).

13. Method as claimed in claim 1, wherein said altering of said musical dynamics is performed at least partly based on the value of an envelope.

14. Method as claimed in claim 1, wherein said sound (S) is a combination of at least two sounds ($S_1$, $S_2$).

15. Method as claimed in claim 1, wherein said parametric equalizer includes at least two cascaded filters.

16. Method as claimed in claim 1, wherein the musical dynamics alteration also eliminates at least one side tone being separate from a fundamental frequency of said sound (S).

17. A non-transitory computer-readable medium having stored therein a computer program comprising codes, which, when run in a computer, causes the computer to execute the method according to claim 1, wherein said computer program is included in the computer readable medium.

18. A system for altering musical dynamics of a sound (S) included in a sound signal, said system comprising: —a parametric equalizer circuit being arranged for filtering said sound signal, said parametric equalizer circuit having a first gain (Gj) and a resonance frequency (fx) being related a pitch frequency (fp) of said sound (S); and —an amplifier circuit being arranged for amplifying said sound signal with a second gain ($G_2$), said second gain ($G_2$) being dependent on said first gain ($G_j$).

19. The system as claimed in claim 18, wherein said second gain ($G_2$) has a value being essentially equal to an inverse of said first gain (G1), $G_2=-G_1$.

20. The system as claimed in claim 18, wherein said second gain ($G_2$) has a value being equal to an inverse of said first gain (Gi) being multiplied with a first factor (ki), G2=-ki*Gi.

21. The system as claimed in claim 18, wherein said first gain ($G_1$) has a value being positive, GI>0, thereby resulting in a loudness for said sound (S) being decreased.

22. The system as claimed in claim 18, wherein said first gain (GI) has a value being negative, $G_1<0$, thereby resulting in a loudness for said sound (S) being increased.

23. The system as claimed in claim 18, wherein said resonance frequency (fx) is essentially equal to said pitch frequency (fp), fr=fp.

24. The system as claimed in claim 18, wherein said resonance frequency (fx) is equal to said pitch frequency (fp) multiplied with a second factor ($k_2$), fr=$k_2$*fp.

25. The system as claimed in claim 18, wherein said parametric equalizer is arranged to have an adaptive value for at least one parameter in the group of: —said first gain ($G_1$) —said resonance frequency ($f_r$), and —a Q factor.

26. The system as claimed in claim 18, wherein said second gain ($G_2$) has a value being essentially equal over frequencies being included in said sound (S).

27. The system as claimed in claim 18, wherein said system is arranged for performing said altering of said musical dynamics dynamically during said sound.

* * * * *